United States Patent [19]

Taguchi et al.

[11] 4,435,657
[45] Mar. 6, 1984

[54] PHASE DETECTOR CIRCUIT

[75] Inventors: Shinichiro Taguchi; Nobuya Nagao; Yutaka Ogihara, all of Fukaya, Japan

[73] Assignee: Tokyo Shibaura Denki Kabushiki Kaisha, Kawasaki, Japan

[21] Appl. No.: 238,951

[22] Filed: Feb. 27, 1981

[51] Int. Cl.$^3$ ...................... H03D 13/00; G01R 25/00
[52] U.S. Cl. ...................... 307/516; 328/134; 328/160
[58] Field of Search ................ 307/514, 516; 328/134, 328/160

[56] References Cited

U.S. PATENT DOCUMENTS

| | | | |
|---|---|---|---|
| 3,519,841 | 7/1970 | Leinfelder | 307/516 |
| 3,840,817 | 10/1974 | Seki | 307/514 |
| 4,001,603 | 1/1977 | Wilcox | 307/516 |
| 4,093,963 | 6/1978 | Uchida | 307/514 |
| 4,242,602 | 12/1980 | Nakagawa et al. | 307/516 |

*Primary Examiner*—John S. Heyman
*Attorney, Agent, or Firm*—Cushman, Darby & Cushman

[57] ABSTRACT

Horizontal sync signal is applied as a reference pulse signal to a first input terminal of a phase detector and is also applied as a gating pulse to a gate circuit. Output of a frequency divider which divides the frequency of the output of a VCO is applied as a comparison pulse to a second input terminal of the phase detector. In the phase detector, a phase detection pulse having a pulse width proportional to the phase difference between the reference pulse and the comparison pulse is obtained. This phase detection pulse is applied through a buffer to a gate circuit. In the gate circuit, the current path from the phase detection pulse input terminal to the output terminal is held conductive during the period of the gating pulse, and during this period an output pulse containing as a component thereof the phase detection pulse mentioned above is obtained. This output pulse is smoothed through a filter to be applied as an oscillation frequency control voltage input to the VCO.

3 Claims, 3 Drawing Figures

PHASE DETECTOR CIRCUIT

PHASE DETECTOR CIRCUIT

This invention relates to phase detector circuits. This sort of circuit is used for, for example, color signal processing circuits in video tape recorders and the like.

In the recording of NTSC video signals on magnetic tape with a video tape recorder, the luminance signal and chrominance signal are separated from the video signal to be recorded. The luminance signal is frequency modulated by a frequency modulator, while the chrominance signal is converted into a signal with a low frequency subcarrier in a color signal processing circuit. The frequency modulated luminance signal and the converted chrominance signal are combined in a mixing circuit, and the resultant signal is recorded on a magnetic tape by a magnetic head. In the color signal processing circuit, the subcarrier frequency of the chrominance signal is converted from $f_{sc}=3.58$ MHz to $(44-\frac{1}{4})f_H$ ($f_H$ denotes the frequency of the horizontal sync signal). The color signal processing circuit includes a converting signal generator for converting the original chrominance into the converted chrominance signal. The converting signal has a frequency of the sum of the original subcarrier frequency (3.58 MHz) and the converted subcarrier frequency (688 kHz), and is synchronized to the horizontal sync signal. The converting signal is also controlled such that it can be used a burst signal. An automatic frequency control circuit (abbreviated as AFC circuit) synchronizes the converting signal frequency (3.58 MHz+688 kHz=$f_{sc}$+(175/4)$f_H$) to the horizontal sync signal frequency. The automatic frequency control circuit includes a voltage-controlled oscillator (abbreviated as VCO), a frequency divider for dividing the frequency oscillated from the VCO output, an integrating circuit for integrating the frequency divider output and generating a sawtooth wave signal, and an AFC detector to which the sawtooth wave signal (which is a compared pulse signal) and the horizontal sync signal (which is a reference pulse signal) are coupled. The AFC detector provides an output which corresponds in voltage to the phase difference between the sawtooth wave signal and the horizontal sync signal. This output is applied to a frequency control terminal of the VCO. The output of the VCO is thus synchronized in frequency to the horizontal sync signal. The circuit described above is termed an AFC loop.

In the AFC loop described above, it is important that the sawtooth wave signal generated from the integrating circuit has steady slant portions, that is, the slant portions of the sawtooth wave signal have good linearity. However, the characteristics of resistors and capacitors that are employed in the integrating circuit are susceptible to temperature changes, which causes the slant portions of the sawtooth wave signal to fluctuate.

The sawtooth wave signal output from the integrating circuit is given as a function $A_0$ which is $$A_0 = E_0 \left(1 - e^{-\frac{t}{RC}}\right),$$

where
$E_0$: the amplitude of the pulse input to the integrating circuit,
$t$: time in second,
RC: the time constant of the integrating circuit.
The slope $\eta$ of the sawtooth wave signal is thus $$\eta = \frac{E_0}{RC} e^{-\frac{t}{RC}} \text{ (V/sec)}$$

where $0 \leq t \leq \tau$ ($\tau$ being the pulse width of pulse input to the integrating circuit). It will be seen from the above equation that the slope of the output sawtooth wave signal is influenced by changes of the time constant with temperature change. This means that the sensitivity of the AFC detector circuit is also changed with temperature change. Under the constant sensitivity of the AFC detector circuit, an output voltage from the AFC detector circuit is in proportion to a phase difference between the sawtooth wave signal and the horizontal sync signal always changes linearly in accordance with the change of the phase difference.

Where the sensitivity of the AFC detector circuit varies with temperature change in the above described conventional AFC detector circuit which employs an integrating circuit, an accurate output signal can no longer be obtained. Besides, the slant portions of the output of the conventional integrating circuit employing the time constant circuit is non-linear, so that the draw-in frequency and the hold frequency of the AFC loop with respect to the center frequency cannot be equalized. Further, in case of fabricating the AFC loop employing the conventional integrating circuit on an IC chip, the capacitor for the time constant circuit cannot but be constructed in an external circuit to the IC chip, so that the large number of connection pins cannot be reduced.

An object of the invention is to provide a phase detector circuit, which alleviates the adverse effects of temperature changes and has steady and stable sensitivity of phase difference detection when detecting phase difference among a pluraility of signals and also reduces the number of required terminal pins in case of implementing on an IC circuit.

For achieving the above object, the phase detector circuit according to the present invention comprises:

a phase detector including a first differential amplifier and a second differential amplifier, a reference pulse signal and a comparison pulse signal being applied to first input terminals of said respective first and second differential amplifiers, preset bias voltages of first and second DC bias voltage sources being applied to second input terminals of said respective first and second differential amplifiers, said second differential amplifier providing from an output terminal thereof a phase detection pulse of a pulse width proportional to the phase difference between the reference pulse and comparison pulse, a buffer circuit connected to the output terminal of said second differential amplifier, for extracting said phase detection pulse output, a gate circuit connected to an output terminal of said buffer circuit, a current path of said buffer circuit between a phase detection pulse input terminal and an output terminal being on-off controlled by said reference pulse signal, said buffer circuit providing an output phase while said current path is in the "on" state, the pulse duty of said output pulse varying according to the pulse width of said phase detection pulse, and a filter for receiving the output of said gate circuit.

This invention can be more fully understood from the following detailed description when taken in conjunction with the accompanying drawings, in which.

Figure 1:
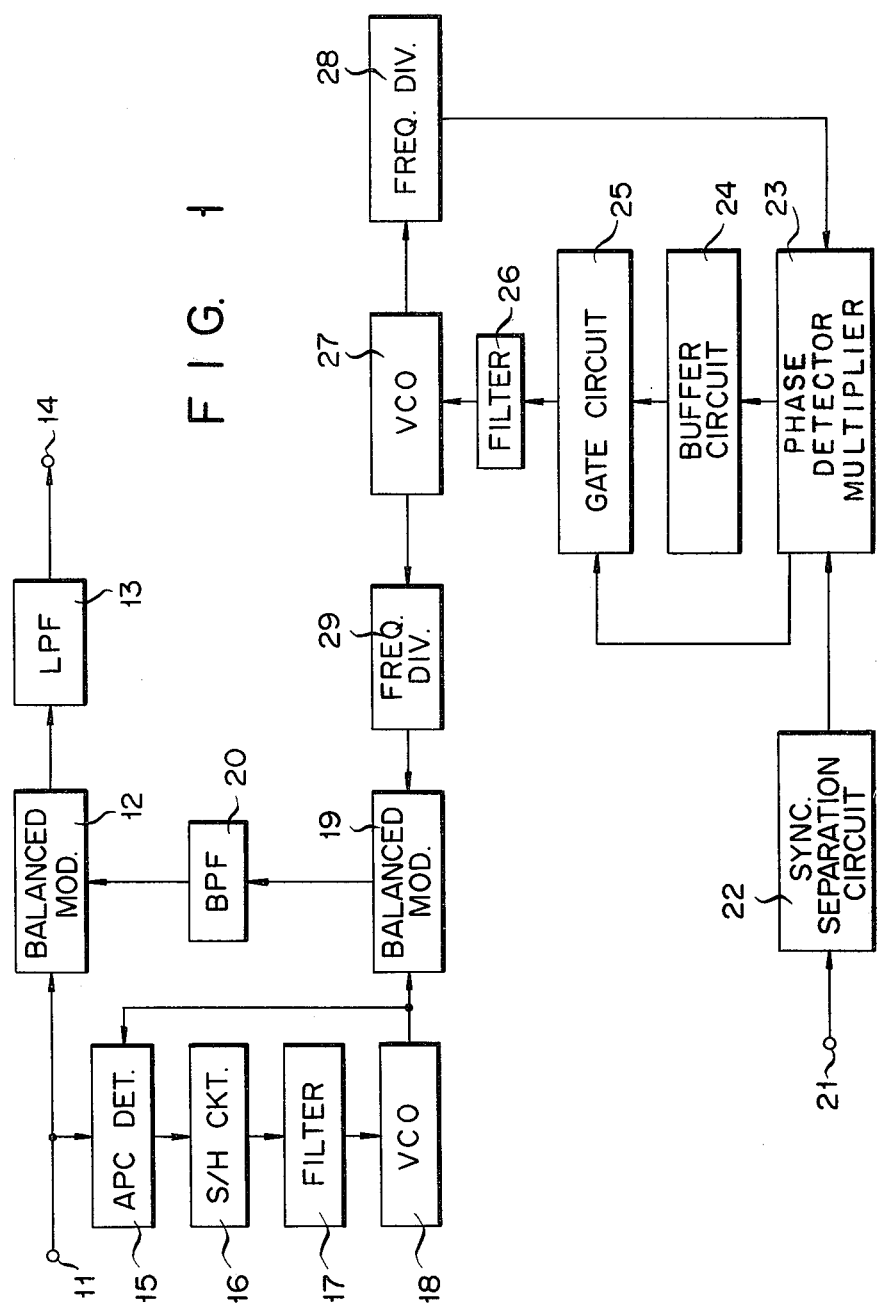
FIG. 1 is a block diagram showing a color signal processing circuit to which the present invention is applied.

FIG. 1 shows a color signal processing circuit for a video tape recorder (VTR), particularly a circuit for recording operation. The color signal (with subcarrier having frequency of 3.58 MHz) separating from the video signal is applied through an input terminal 11 to a first input terminal of a first balanced modulator 12 and then converted to a low frequency converted color signal described later in detail. The converted color signal is then filtered out through a filter 13 to an output terminal 14.

The original color signal is also applied to an automatic phase control detector (abbreviated as APC detector) 15 which constitutes part of an automatic phase control loop (APC loop). In the APC detector 15, the burst signal included in the original color signal is compared in phase with the output (at 3.58 MHz) from a first VCO 18 among the gating period according to the burst pulse. The resultant voltage which corresponds to the phase difference between the burst signal and the output of the first VCO 18 is sampled and held by a following sample-and-hold circuit 16 under the control of the burst gating pulse. The output voltage of the sample-and-hold circuit 16 is coupled through a low-pass filter 17 to an oscillation frequency control terminal of the first VCO 18. Thus, the output of the first VCO 18 is locked in phase to the burst signal.

The output of the VCO is also fed to a first input terminal of a second balanced modulator 19. To a second input terminal of the second balanced modulator 19 is fed an output (688 kHz) of a frequency divider 29, which divides the frequency (2.7 MHz) of the output of second VCO 27 to ¼.

The output of the second balanced modulator 19 thus has a frequency of 3.58 MHz+688 kHz or roughly 4.2 MHz. This output (4.2 MHz) is applied through a filter 20 to a second input terminal of the first balanced modulator 12 as a converting signal. The original color signal is modulated at the first balanced modulator 12 with the output or the converting signal from the filter 20. As a result, the low frequency converted color signal is obtained at the output terminal of the first balanced modulator 12.

The second VCO 27 is automatically frequency controlled such that its output frequency ($175 \times f_H = 27$ MHz) is synchronized to the horizontal sync signal frequency ($f_H$).

In the color signal processing system for a video tape recorder, the frequency (688 kHz) of the low frequency converted color signal has to be synchronized to the frequency ($f_H$) of the horizontal sync signal included in the video signal. Accordingly, this is because of the fact that the horizontal sync signal variations have effects upon the color signal phase variations. The circuit that is involved is designed to maintain a constant relation of the low frequency converted color signal frequency and horizontal sync signal frequency to each other.

The video signal is fed through an input terminal 21 to a sync separator 22. The sync separator 22 separates the horizontal sync signal from the video signal. The horizontal sync signal is applied to a first input terminal of a phase detector multiplier 23 and also to a gating pulse input terminal of a gate cicuit 25 both being included in an AFC loop. To a second input terminal of the phase detector multiplier 23 is applied to output ($5f_H$) of a frequency divider 28, which divides the output frequency ($175 \times f_H = 2.7$ MHz) of the second VCO 27 to 1/35.

Phase detector multiplier 23 detects the phase difference between of the horizontal sync signal and the frequency divider output, and provides a phase detection pulse output which corresponds to the deviation from sychronization between the horizontal sync signal (at $f_H = 15.73$ kHz) and the frequency divider output (at $5f_H$). The phase detector output pulse is applied through a buffer 24 to the gate circuit 25. In the gate circuit 25, the path between its phase detection pulse input terminal and output terminal is enabled, i.e., rendered conductive, during the horizontal sync signal period, thus producing an output pulse of a pulse duty proportional to the pulse width of the phase detection pulse.

The invention can be effectively applied to the circuit composed of the phase detector 23, buffer 24 and gate circuit 25 shown in FIG. 1.

Figure 2:
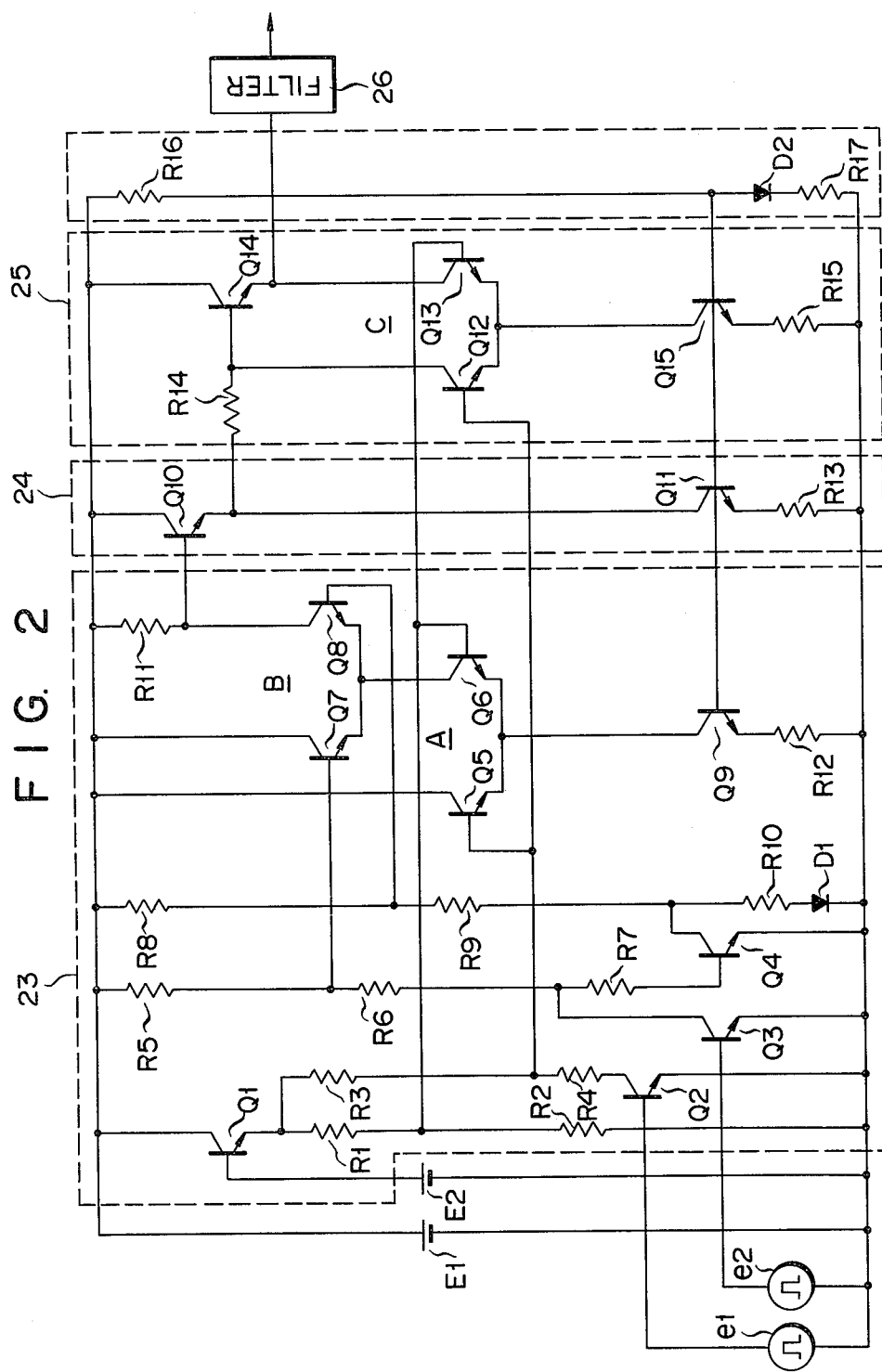
FIG. 2 is a circuit diagram showing an embodiment of the present invention.

FIG. 2 shows a specific circuit construction of an embodiment of the invention. Referring to the Figure, labeled $e_1$ is a reference pulse signal (for instance the horizontal sync signal) from a first signal source such as in the FIG. 1 embodiment the signal from sync. separation circuit 22, and labeled $e_2$ is a compared pulse signal (for instance a frequency divider output such as in the FIG. 1 embodiment the signal from frequency divider 28) from a second signal source (for instance a VCO). Labeled $E_1$ is a first DC bias voltage source, and labeled $E_2$ is a second DC bias voltage source. The second DC bias voltage $E_2$ is applied to the base of a transistor $Q_1$. The transistor $Q_1$ has its collector connected to the first DC bias voltage source $E_1$ and its emitter connected in series with resistors $R_1$ and $R_2$ to a reference potential terminal. The emitter of the transistor $Q_1$ is also connected in series with resistors $R_3$ and $R_4$ to the collector of a transistor $Q_2$. The transistor $Q_2$ has its emitter connected to the reference potential terminal and upon its base upon is the aforementioned reference pulse signal $e_1$ impressed.

The compared pulse signal $e_2$ is applied to the base of a transistor $Q_3$. The first DC bias voltage source $E_1$ is connected through resistors $R_5$ and $R_6$ to the collector of the transistor $Q_3$, and this collector is connected through a resistor $R_7$ to the base of the transistor $Q_4$. The transistor $Q_4$ has its emitter connected to the reference potential terminal and its collector to the DC bias $E_1$ through resistors $R_8$ and $R_9$. The collector of the transistor $Q_4$ is also connected through a resistor $R_{10}$ and a diode $D_1$ to the reference potential terminal. The diode $D_1$ is a temperature compensation diode.

The juncture between the resistors $R_1$ and $R_2$ is connected to the bases of transistors $Q_6$ and $Q_{13}$, and the juncture between the resistors $R_8$ and $R_9$ is connected to the base of a transistor $Q_8$. In other words, the potential at the juncture between the resistors $R_1$ and $R_2$ is set as the base bias for the transistors $Q_6$ and $Q_{13}$, and the potential at the juncture between the resistors $R_8$ and $R_9$ is set as the base bias for the transistor $Q_8$. Transistors $Q_5$ and $Q_6$ form a first differential amplifier A, transistors Q7 and Q8 form a second differential amplifier B, and transistors Q12 and Q13 form a third differential amplifier C.

The reference pulse e1 is applied through the transistor Q2 and resistor R4 to the base of the transistor Q5 of the first differential amplifier A and also to the base of the transistor Q12 of the second differential amplifier C. The compared pulse signal e2 is applied through the transistor Q3 and resistor R6 to the base of the transistor Q7 of the second differential amplifier B. The transistors Q5 and Q6 have their emitters commonly connected to the collector of a transistor Q9 which forms a current source. The emitter of the transistor Q9 is connected through a resistor R12 to the reference potential terminal. The first DC bias voltage source E1 is connected to the collector of the transistor Q5, and the transistors Q7 and Q8 have their emitters commonly connected to the collector of the transistor Q6. The first DC bias voltage source is directly connected to the collector of the transistor Q7, and it is also connected through a resistor R11 to the collector of the transistor Q8. The collector of the transistor Q8 is also connected to the base of a transistor Q10 which is a component element of the buffer 24.

The first differential amplifier A is constituted by the transistor Q5 and Q6 and the second differential amplifier B is constituted by the transistors Q7 and Q8 from the phase detector 23.

The transistor Q10 of the buffer 24 has its collector to which the first DC bias voltage source E1 is connected and its emitter connected to the collector of a transistor Q11. The transistor Q11 forms a constant current source, and its emitter is connected to the reference potential terminal. The emitter of the transistor Q10 is connected to the output terminal of the buffer 24, and it is connected through a resistor R14 to the base of a transistor Q14.

The transistors Q14, Q12 and Q13 form the gate circuit 25. The collector of the transistor Q12 is connected to the base of the transistor Q14, which has its emitter connected to the collector of the transistor Q13. The first DC bias voltage source E1 is connected to the collector of the transistor Q14. The transistors Q12 and Q13 have their emitters commonly connected to the collector of a transistor Q15 which forms a constant current source. The emitter of the transistor Q15 is connected through a resistor R15 to the reference potential source. The emitter of the transistor Q14 is connected to the filter 26.

A series circuit including a resistor R16, a diode D2 and a resistor R17 sets the base bias for the constant current source transistors Q9, Q11 and Q15. The diode D2 serves the roles of bias setting and temperature compensation. The current through the collector-emitter path of the transistor Q9 is set equal to the current through the diode D2. In other words, the current path formed by the transistor Q9 and resistor R12 and that by the resistor R16, diode D2 and resistor R17 form a current mirror circuit.

Figure 3:
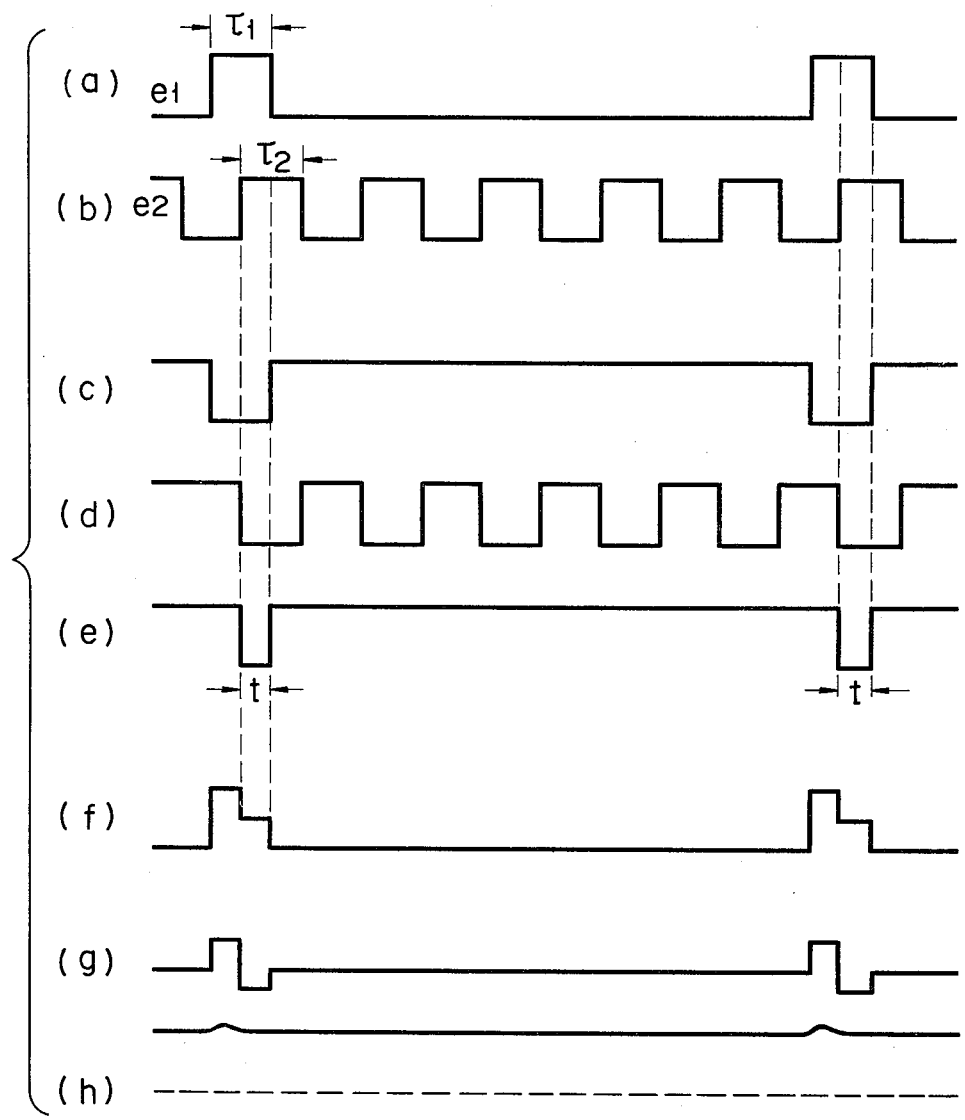
FIG. 3 is a waveform diagram showing signal waveforms at various parts of the circuit of FIG. 2 with the letters designating the waveforms indicating the part in FIG. 2.

The operation of the phase detector 23, buffer 24 and gate circuit 25, having the above construction, will now be described. It is now assumed that the reference pulse signal e1 and compared pulse signal e2 are related to each other as shown in (a) and (b) in FIG. 3. When the reference pulse signal e1 goes to a high level, the potential of the collector on the transistor Q2 is reduced. In consequence, the signal to the base of the transistors Q5 and Q12 goes to a low level as shown in (c) in FIG. 3. When the compared pulse signal e2 goes to a high level, the collector potential on the transistor Q3 is reduced. In consequence, the signal to the base of the transistor Q7 goes to a low level as shown in (d) in FIG. 3. The transistors Q6 and Q8 are both on state during a period t shown in (e) in FIG. 3. During this period t, a phase as shown in (e) in FIG. 3 prevails at the base of the transistor Q10. The current through the transistor Q10 is controlled by the pulse shown in (e) in FIG. 3.

When the reference pulse e1 goes to a high level, the transistor Q12 is cut off, while the transistor Q13 is triggered. (While the reference pulse e1 is at the low level, the transistor Q12 is "on" and the transistor Q13 is "off".) Thus, the base potential on the transistor Q14 is increased when the transistor Q12 is cut off and is reduced when the current through the transistor Q10 is subsequently controlled. The signal to the base of the Q14 thus has a waveform as shown in (f) in FIG. 3, and a signal as shown in (g) in FIG. 3 appears from the emitter of the transistor Q14. In other words, in the gate circuit 25, the current path between the phase detection pulse input terminal and output terminal is conductive while the reference pulse e1 is at the high level, and during this period the pulse duty of the output pulse is set. When the reference pulse and compared pulse go to high level at the same time a phase detection pulse can be obtained, a pulse width of said phase detection pulse proportion between the reference pulse and compared pulse, to the collector of transistor Q8. Thus, the output (as shown in (h) in FIG. 3) of the filter 26 can be utilized as a voltage which corresponds to the phase difference between the reference pulse and compared pulse.

The current I through the emitter of the transistor Q9 in the automatic frequency control phase detector 26 is given as $$I = \frac{E_1 - V_F}{R_{16} + R_{17}} \cdot \frac{R_{17}}{R_{12}} \quad (1)$$

where
$V_F$: the forward voltage across the diode $D_2$,
$R_{12}$: the resistance of the resistor $R_{12}$,
$R_{16}$: the resistance of the resistor $R_{16}$,
$R_{17}$: the resistance of the resistor $R_{17}$.

This means that the current path constituted by the resistor $R_{16}$, diode $D_2$ and resistor $R_{17}$ and that constituted by the transistor $Q_9$ and resistor $R_{12}$ form a current mirror circuit.

The sensitivity $\mu$ of the phase detector 26 is given as $$\mu \approx \frac{R_{17}}{R_{16} + R_{17}} \cdot \frac{R_{11}}{R_{12}} \cdot \frac{E_1 - V_F}{\tau_1} \text{ (V/sec)} \quad (2)$$

under the assumption that $\tau_1 \leq \tau_2$ where $\tau_1$ is the pulse width of the reference pulse e1 and $\tau_2$ is the pulse width of the compared pulse e2.

As is seen from the above equation, the sensitivity of the phase detector is determined by the resistance ratio $$\frac{R_{17}}{R_{16} + R_{17}} \cdot \frac{R_{11}}{R_{12}}.$$

Since the resistors $R_{11}$, $R_{12}$, $R_{16}$, $R_{17}$, etc. can be realized as distributed resistance within a semiconductor integrated circuit, the error of the aforementioned resistance ratio $$\frac{R_{17}}{R_{16} + R_{17}} \cdot \frac{R_{11}}{R_{12}}$$

can be held within 3%.

Thus, sufficiently high precision of the sensitivity can be obtained. Also, satisfactory linearity of the sensitivity can be obtained as is seen from equation (2).

In equation (2), only $V_F$ is dependent upon the temperature. If the circuit constants are selected such that $E_1 >> V_F$ and $R_{16} >> R_{17}$, $\mu$ can be approximated as $$\mu \approx \frac{R_{17}}{R_{16}} \cdot \frac{R_{11}}{R_{12}} \cdot \frac{E_1}{\tau_1} \quad (3)$$

In this case, the temperature changes have practically no influence upon the sensitivity.

What we claim is:

1. A phase detector circuit comprising:
   a phase detector including a first differential amplifier and a second differential amplifier, a reference pulse signal and a comparison pulse signal being applied to first input terminals of said respective first and second differential amplifiers, preset bias voltages of first and second DC bias voltage sources being applied to second input terminals of said respective first and second differential amplifiers, said second differential amplifier providing from an output terminal thereof a phase detection pulse of a pulse width proportional to the phase difference between the reference pulse and comparison pulse,
   a buffer circuit connected to the output terminal of said second differential amplifier, for extracting said phase detection pulse output,
   a gate circuit connected to an output terminal of said buffer circuit, a current path of said buffer circuit between a phase detection pulse input terminal and an output terminal being controlled to on or off by said reference pulse signal, said buffer circuit providing an output pulse while said current path is in the "on" state, the pulse duty of said output pulse varying according to the pulse width of said phase detection pulse, and
   a filter for receiving the output of said gate circuit.

2. A phase detector circuit according to claim 1, which comprises:
   a first transistor having the base connected through a first resistor to said first DC bias voltage source and also connected through a diode and a second resistor to a reference potential terminal and the emitter connected through a third resistor to said reference potential terminal;
   a second transistor having the emitter connected to the collector of said first transistor, the base connected to a signal line to which said reference pulse signal is applied and the collector connected to said first DC bias voltage source;
   a third transistor having the emitter connected to the emitter of said second transistor and the base connected to a first biasing means, said second and third transistors constituting said first differential amplifier;
   a fourth transistor having the emitter connected to the collector of said third transistor, the base connected to a signal line to which said comparison pulse signal is applied and the collector connected to said first DC bias voltage source; and
   a fifth transistor having the emitter connected to the emitter of said fourth transistor, the base connected to a second biasing means, and the collector connected through a fourth resistor to said first DC bias voltage source, said fourth and fifth transistors constituting said second differential amplifier.

3. A phase detector circuit for providing an output signal indicative of a phase difference between an input signal and a reference signal, comprising:
   a multiplying circuit for multiplying said input and reference signals and providing a multiplied signal indicative thereof;
   a signal transmission path for transmitting said multiplied signal to an output circuit; and
   means for interrupting said signal transmission path in synchronism with said reference signal; thereby obtaining at said output circuit said output signal in accordance with the phase difference between said input and reference signals.

* * * * *